(12) United States Patent
Yumoto et al.

(10) Patent No.: US 11,873,553 B2
(45) Date of Patent: Jan. 16, 2024

(54) COMPONENT AND APPARATUS OF MANUFACTURING SEMICONDUCTOR

(71) Applicants: SHIBAURA INSTITUTE OF TECHNOLOGY, Tokyo (JP); TOSHIBA MATERIALS CO., LTD., Yokohama (JP)

(72) Inventors: Atsushi Yumoto, Tokyo (JP); Tomohiro Sugano, Tokyo (JP); Takashi Hino, Kanagawa (JP); Tetsuo Inoue, Kanagawa (JP); Shuichi Saito, Kanagawa (JP)

(73) Assignees: SHIBAURA INSTITUTE OF TECHNOLOGY, Tokyo (JP); TOSHIBA MATERIALS CO., LTD., Kanagawa-Ken (JP)

(*) Notice: Subject to any disclaimer, the term of this patent is extended or adjusted under 35 U.S.C. 154(b) by 382 days.

(21) Appl. No.: 16/804,292

(22) Filed: Feb. 28, 2020

(65) Prior Publication Data
US 2020/0208253 A1 Jul. 2, 2020

Related U.S. Application Data

(63) Continuation of application No. PCT/JP2018/031817, filed on Aug. 28, 2018.

(30) Foreign Application Priority Data

Sep. 1, 2017 (JP) .................. 2017-168524

(51) Int. Cl.
C23C 14/08 (2006.01)
C23C 14/28 (2006.01)
(Continued)

(52) U.S. Cl.
CPC ............. *C23C 14/083* (2013.01); *C23C 14/28* (2013.01); *H01J 37/32477* (2013.01); *H01L 21/67069* (2013.01); *H01J 2237/332* (2013.01)

(58) Field of Classification Search
CPC .. C23C 14/083; C23C 14/28; H01J 37/32477; H01J 2237/332; H01L 21/67069
(Continued)

(56) References Cited

U.S. PATENT DOCUMENTS

2005/0150866 A1* 7/2005 O'Donnell ........ H01J 37/32477
156/345.43
2007/0241096 A1 10/2007 Kimura et al.
(Continued)

FOREIGN PATENT DOCUMENTS

JP 2007287379 A 11/2007
JP 4905697 B2 3/2012
(Continued)

OTHER PUBLICATIONS

Pengfei (Applied Surface Science 410, pp. 470-478, Mar. 2017) (Year: 2017).*
(Continued)

*Primary Examiner* — Charlee J. C. Bennett
(74) *Attorney, Agent, or Firm* — Harness, Dickey & Pierce, P.L.C.

(57) ABSTRACT

A component comprises a film containing yttrium oxide. A cross section of the film has a first portion, a second portion, and a third portion, and the first to third portions are separated from each other by 0.5 mm or more. A Vickers hardness B1 measured in the first portion, a Vickers hardness B2 measured in the second portion, a Vickers hardness B3 measured in the third portion, and an average value A of the Vickers hardnesses B1 to B3 are numbers satisfying $0.8A \leq B1 \leq 1.2A$, $0.8A \leq B2 \leq 1.2A$, and $0.8A \leq B3 \leq 1.2A$.

9 Claims, 5 Drawing Sheets

(51) Int. Cl.
  *H01L 21/67* (2006.01)
  *H01J 37/32* (2006.01)
(58) Field of Classification Search
  USPC ..................................................... 118/723 R
  See application file for complete search history.

(56) References Cited

U.S. PATENT DOCUMENTS

| | | | |
|---|---|---|---|
| 2013/0251949 A1* | 9/2013 | Sato .................. | H01J 37/32477 428/323 |
| 2014/0099491 A1* | 4/2014 | Ameen ................ | C23C 16/405 427/535 |
| 2014/0178679 A1 | 6/2014 | Gunda | |
| 2017/0022595 A1 | 1/2017 | Sato et al. | |
| 2017/0029628 A1 | 2/2017 | Takai et al. | |
| 2017/0114440 A1 | 4/2017 | Takai et al. | |

FOREIGN PATENT DOCUMENTS

| | | |
|---|---|---|
| JP | 4994121 B2 | 8/2012 |
| JP | 2016050925 A | 4/2016 |
| JP | 2017031457 A | 2/2017 |
| JP | 2017082325 A | 5/2017 |
| JP | 2017128811 A | 7/2017 |
| JP | 2017145446 A | 8/2017 |
| WO | WO-2010027073 A1 | 3/2010 |
| WO | WO-2015151857 A1 | 10/2015 |

OTHER PUBLICATIONS

Iwasawa (JACS., 90 [8] pp. 2327-2332 (2007)) (Year: 2007).*
Maeno Yukari, Yumoto Atsushi, Nagayama Katsuhisa, Naoe Kazuaki, Tenmei Hiroyuki, Niwa Naotake; "Fabrication of high electrical resistivity AlN film with Supersonic Free-Jet PVD"; 2013 Spring National Meeting of Japan Thermal Spray Society, Technical Program; pp. 21-22; Jun. 20-21, 2013; Wel-tobata, Kitakyushu, Fukuoka, Japan; with English machine translation.

* cited by examiner

COMPONENT AND APPARATUS OF MANUFACTURING SEMICONDUCTOR

CROSS-REFERENCE TO RELATED APPLICATIONS

This application is a continuation of prior International Application No. PCT/JP2018/031817 filed on Aug. 28, 2018; the entire contents of all of which are incorporated herein by reference.

FIELD

One embodiment of the present invention relates to a component and an apparatus of manufacturing semiconductor.

BACKGROUND

At least one of components configuring a semiconductor manufacturing apparatus that performs plasma processing, is brought into contact with plasma in the semiconductor manufacturing apparatus. At this time, in order to suppress generation of a reaction product of the component and the plasma, or suppress corrosion of the component caused by the plasma, it is preferable to form an oxide film that protects a surface of a base member of the component.

An oxide film is formed by using a thermal spraying method, for example. In the thermal spraying method, a molten substance of oxide particle is made to collide with a surface of a base member, and rapidly cooled and solidified to be deposited on the surface of the base member, to thereby form the oxide film. For this reason, the formed oxide film has a lot of defects such as pores. When the oxide film has a lot of defects, the oxide film is likely to react with plasma or is likely to be corroded.

If the oxide film having a lot of defects is irradiated with active radicals generated by plasma discharge, for example, particles derived from the oxide film are likely to be generated. The aforementioned particles cause short circuit or wire breakage of fine wiring or the like, for example, to reduce product yields of a semiconductor device or the like, and increase a cleaning frequency and an exchange frequency of a component for semiconductor manufacturing apparatus, to cause reduction in productivity and increase in film formation cost.

DETAILED DESCRIPTION

A component comprises a film containing yttrium oxide. A cross section of the film has a first portion, a second portion, and a third portion, and the first to third portions are separated from each other by 0.5 mm or more. A Vickers hardness B1 measured in the first portion, a Vickers hardness B2 measured in the second portion, a Vickers hardness B3 measured in the third portion, and an average value A of the Vickers hardnesses B1 to B3 are numbers satisfying 0.8A≤B1≤1.2A, 0.8A≤B2≤1.2A, and 0.8A≤B3≤1.2A.

Hereinafter, embodiments will be described with reference to the drawings. The same reference signs denote the same ones. It should be noted that the drawings are schematic or conceptual, and a relation between thickness and width of each part, a coefficient of ratio of sizes among parts, and so on are not necessarily the same as actual ones. Further, even the same part may be illustrated with different dimensions and coefficients of ratio in different drawings.

Figure 1:
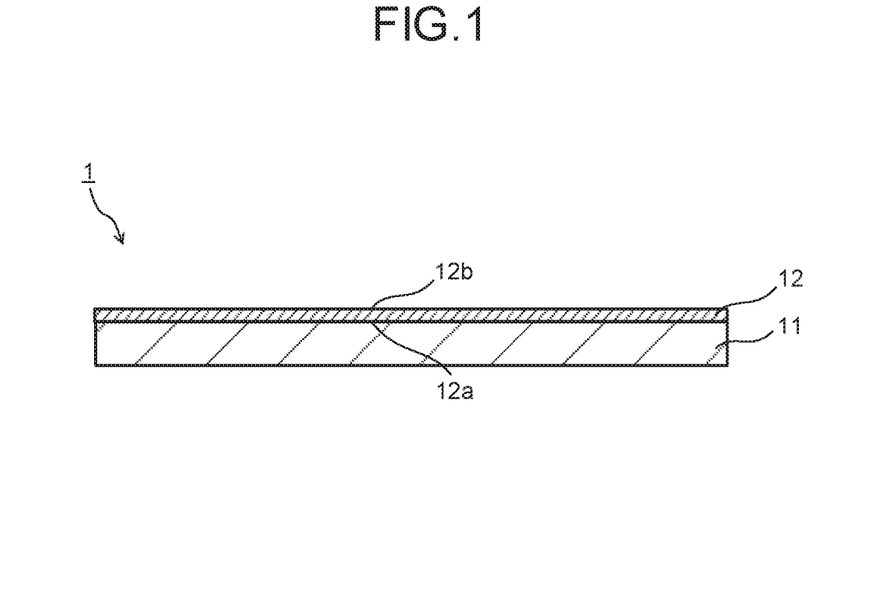
FIG. 1 is a cross-sectional schematic view illustrating a structural example of a component.

FIG. 1 is a cross-sectional schematic view illustrating a structural example of a component. A component 1 illustrated in FIG. 1 includes a film 12 provided on a surface of a base member 11.

As the base member 11, there can be cited, for example, a member which is exposed to plasma or radical. A shape of the base member 11 is not particularly limited, and it may be a plate shape or a columnar shape, for example. As the aforementioned member, there can be cited, for example, a member of a semiconductor manufacturing apparatus, a liquid crystal device manufacturing apparatus, or the like, and concretely, there can be cited a discharge tube, a wafer arrangement member, an inner wall portion, a deposition shield, an insulator ring, an upper electrode, a baffle plate, a focus ring, a shield ring, an electrostatic chuck, a bellows cover, or the like.

The base member 11 contains, for example, a ceramic material or a metal material. As the ceramic material, there can be cited, for example, quartz, aluminum oxide, aluminum nitride, or the like. As the metal material, there can be cited, for example, copper, aluminum, or the like.

The film 12 has a function as a protective film of the base member 11. The film 12 has a face 12a which is brought into contact with the base member 11, and a face 12b which faces the face 12a. A thickness of the film 12 is preferably, for example, 2 μm or more and 200 μm or less, and more preferably 20 μm or more and 200 μm or less. If the film 12 is excessively thin, durability is reduced. If the film 12 is excessively thick, film peeling due to stress is likely to occur. When the thickness is 2 μm or more, an insulation property can be enhanced. When the film has the thickness of 2 μm or more and 200 μm or less, it is possible to use the component for a semiconductor manufacturing apparatus or the like.

The film 12 is an oxide film containing yttrium oxide ($Y_2O_3$). The film 12 is preferably an oxide film containing yttrium oxide as its major constituent. In the oxide film containing yttrium oxide as its major constituent, 50 mass % or more of the film 12 is composed of yttrium oxide. Further, the film 12 is more preferably an oxide film composed only of yttrium oxide. The oxide film containing yttrium oxide is preferable since it has a high plasma resistance. The plasma resistance indicates, for example, the difficulty of reaction with respect to plasma, the difficulty of corrosion caused by plasma, and the like.

The component 1 may have a base film between the base member 11 and the film 12 according to need. The base film is provided for the purpose of improving adhesiveness between the base member 11 and the film 12. When the base film is provided, the thickness of the film 12 is a thickness as a result of excluding the thickness of the base film. The component 1 may also have a film having a gradient composition of the base film and the yttrium oxide film.

In order to improve the plasma resistance of the component 1, it is preferable to improve a Vickers hardness $H_V$ of the film 12. In the component of the embodiment, a high plasma resistance is realized by reducing a variation in the Vickers hardness $H_V$ of the film.

Figure 2:
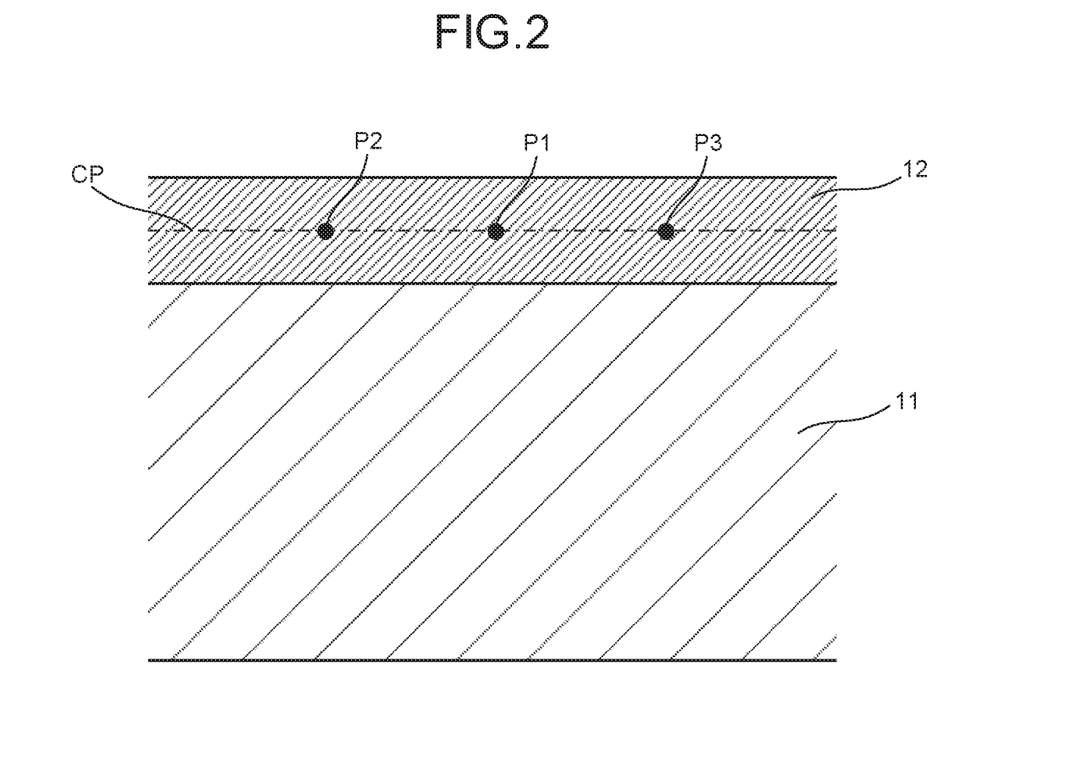
FIG. 2 is a view for explaining an evaluation method of a variation in a Vickers hardness $H_V$ of a film containing yttrium oxide.

The variation in the Vickers hardness $H_V$ of the film 12 is evaluated by the following method, for example. FIG. 2 is a view for explaining an evaluation method of the variation in the Vickers hardness $H_V$ of the film 12. First, the Vickers hardness $H_V$ is measured in each of arbitrary portion P1 to portion P3 in a cross section of the film 12. The portion P1 to the portion P3 are positioned, for example, on a center part CP in a thickness direction of the film 12. The portion P1 to the portion P3 are separated from each other by 0.5 mm or more on the center part CP.

The Vickers hardness $H_V$ is measured according to JIS-R-1610. An indentation load in the measurement is 5 gfN (0.049 N) or more and 25 gfN (0.245 N) or less. The cross section of the film 12 has a surface roughness Ra of 1 μm or less by being subjected to ion milling processing. The surface roughness Ra is measured according to JIS-B-0601-1994, for example.

When the film 12 is excessively thin and thus the indentation cannot be formed, it is possible to measure a nanoindentation hardness $H_{IT}$ by using a nanoindentation method, and calculate the Vickers hardness $H_V$ from the nanoindentation hardness $H_{IT}$. The nanoindentation hardness $H_{IT}$ (GPa) is converted into the Vickers hardness $H_V$ (kgf/mm$^2$) by using the following expression.

$$H_V=(76.23 \times H_{IT})+6.3$$

Figure 3:
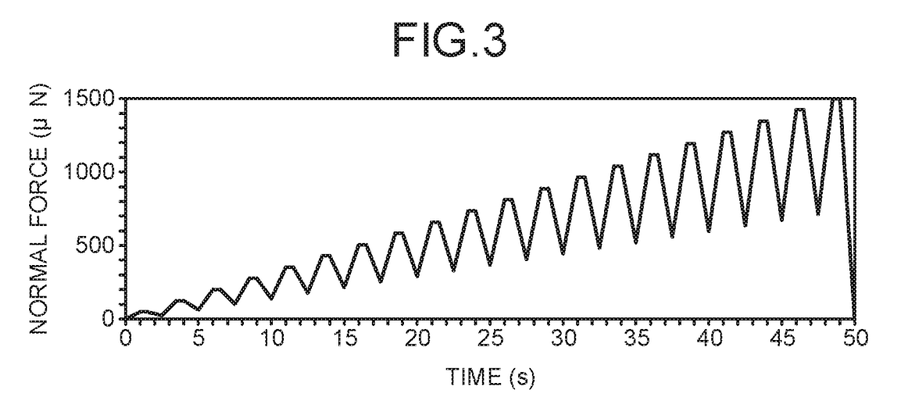
FIG. 3 is a view illustrating a loading condition in a measuring test of a nanoindentation hardness $H_{IT}$ using a nanoindenter.

The nanoindentation hardness $H_{IT}$ is measured by using a nanoindenter. In the measurement using the nanoindenter, the hardness can be determined by pressing an indenter into a sample surface with a slight force, and measuring an indentation depth and a pressing force at that time. The indentation of the nanoindenter is small to be about 1 μm. For this reason, the hardness of a minute region can be measured. The nanoindentation hardness $H_{IT}$ is measured by using, for example, a nanoindenter manufactured by Hysitron, Inc., and using a triangular pyramid indenter of Berkovich-type diamond. A maximum load is 1500 μN (micronewton), and the load is gradually increased by taking 50 seconds. FIG. 3 is a view illustrating a loading condition in a measuring test of the nanoindentation hardness $H_{IT}$ using the nanoindenter. The indentation depth at this time is measured, to thereby determine the nanoindentation hardness $H_{IT}$.

A Vickers hardness B1 measured in a portion P1, a Vickers hardness B2 measured in a portion P2, a Vickers hardness B3 measured in a portion P3, and an average value A of the Vickers hardnesses B1 to B3 are respectively numbers satisfying 0.8A≤B1≤1.2A, 0.8A≤B2≤1.2A, and 0.8A≤B3≤1.2A.

When the film 12 satisfies the aforementioned expressions, the film 12 is difficult to react with plasma, and is difficult to be corroded by plasma. Specifically, the film 12 has a high plasma resistance. When A, B1, B2, and B3 satisfy the aforementioned expressions, this indicates that the variation in the Vickers hardness $H_V$ of the film 12 is small. This indicates that bonding of mutual yttrium oxide particles configuring the film 12 is homogeneous. When the film 12 is exposed to plasma, corrosion proceeds from a portion where the bonding of mutual yttrium oxide particles is weak. If the film 12 is partially corroded, the corroded portion becomes more likely to be corroded. When the variation in the Vickers hardness $H_V$ is small, it is possible to suppress the partial corrosion caused by the plasma. For this reason, A, B1, B2, and B3 preferably satisfy the aforementioned expressions. Further, when the variation in the Vickers hardness $H_V$ is small, this also indicates that defects such as pores are few in the film 12.

The aforementioned A is preferably 600 or more, and more preferably 700 or more. As A becomes higher, the plasma resistance can be improved more.

The film 12 has monoclinic crystals of yttrium oxide. A mass ratio of the aforementioned monoclinic crystals in the film 12 is preferably 60% (60 mass %) or more, and more preferably 80% (80 mass %) or more. The yttrium oxide ($Y_2O_3$) has a crystal structure of monoclinic crystal, cubic crystal, or hexagonal crystal. A phase change from a cubic crystal to a monoclinic crystal occurs at around 1800° C. Further, a phase change from a monoclinic crystal to a hexagonal crystal occurs at around 2200° C. When the monoclinic crystals are 60 mass % or more, the phase change is difficult to occur in the film 12 at a temperature up to around 2200° C. For this reason, even if a manufacturing process of a semiconductor element using plasma is conducted at a temperature of 300° C. or more and 1000° C. or less, it is possible to realize the film 12 excellent in the plasma resistance. A manufacturing process using a compound semiconductor requires a high temperature of about 500 to 600° C. By increasing the proportion of monoclinic crystals, excellent durability is exhibited even under a plasma environment at 500 to 600° C.

Figure 4:
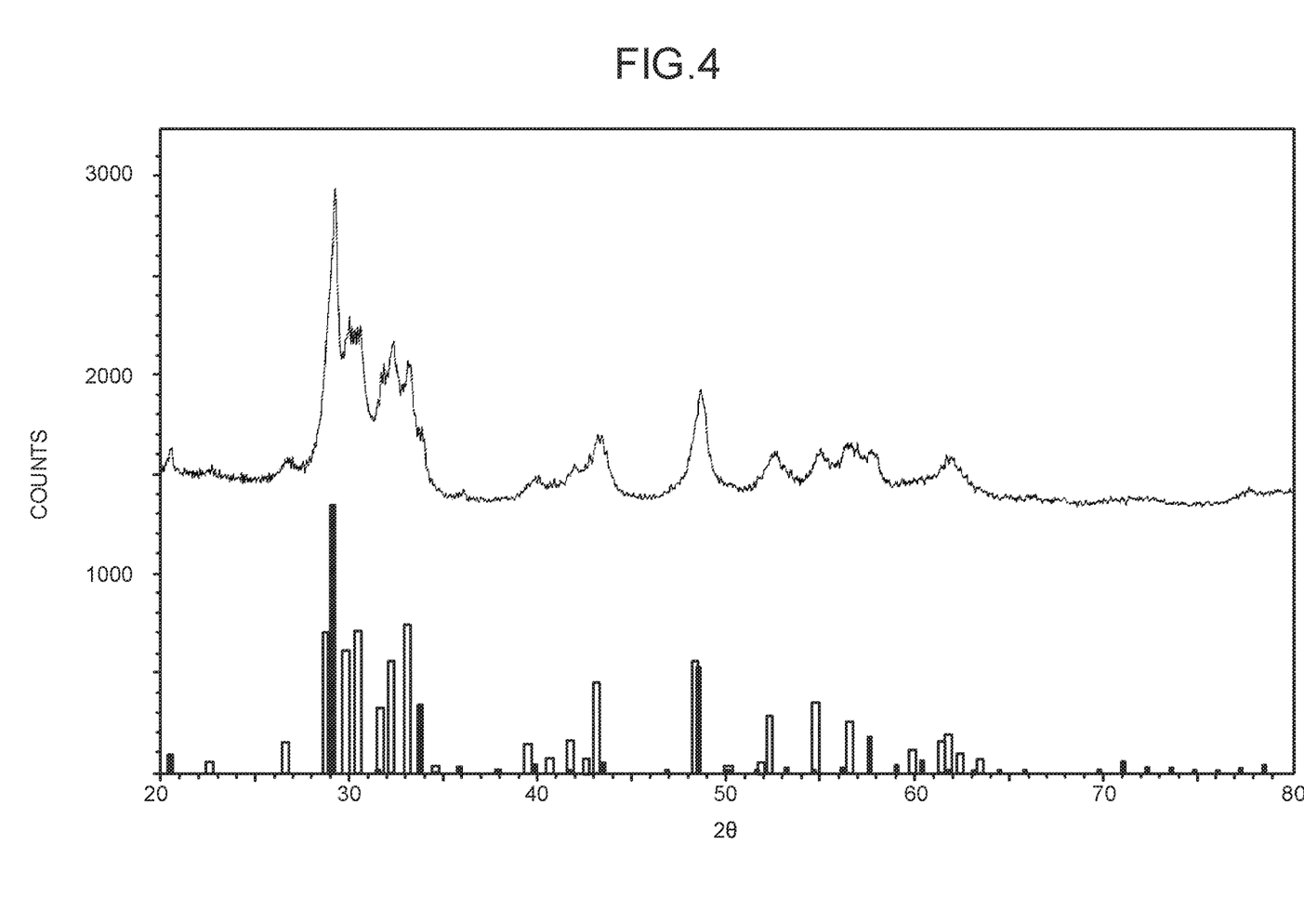
FIG. 4 is a view illustrating an example of an X-ray diffraction pattern of a film containing yttrium oxide.

The mass ratio of the monoclinic crystals is determined by using an X-ray diffraction pattern obtained by measuring the film 12 through an X-ray diffraction (XRD) analysis. FIG. 4 is a view illustrating an example of the X-ray diffraction pattern of the film 12. The X-ray diffraction pattern illustrated in FIG. 4 has a plurality of peaks indicating monoclinic crystals and a plurality of peaks indicating cubic crystals. In FIG. 4, a peak indicated in white represents a peak of the monoclinic crystal, and a peak indicated in black represents a peak of the cubic crystal. The peak indicating the monoclinic crystal and the peak indicating the cubic crystal are determined based on PDF cards.

In the XRD analysis, a Cu target is used as a target, a tube voltage is set to 40 mV, and a tube current is set to 40 mA. From a qualitative analysis result in a range of diffraction angle 2θ=20 degrees to 80 degrees based on a 2θ/θ method, a quantitative analysis is performed by using a reference intensity ratio (RIR) method. When a quantitative value of monoclinic crystals is set to Im and a quantitative value of cubic crystals is set to Ic, the mass ratio (%) of the monoclinic crystals can be determined by the following expression.

$$(Im/(Im+Ic)) \times 100 = \text{mass ratio (\%) of monoclinic crystals}$$

The quantitative value Im of monoclinic crystals indicates a total value of heights of peaks indicating individual monoclinic crystals. Further, the quantitative value Ic of cubic crystals indicates a total value of heights of peaks indicating individual cubic crystals. If analysis software is used, aggregation of Im and Ic is efficiently performed.

The XRD analysis is performed according to a concentration method or a thin film method. When the XRD analysis is performed according to the concentration method, a base member composed of a material that exerts no influence on peak detection is used. As the base member, there can be cited an amorphous substrate, for example.

When the film 12 is thin and is influenced by the base member, it is also possible to perform measurement according to the thin film method.

In an observation image obtained by observing the face 12b by using a laser microscope at 50 magnifications, a ratio of a surface area (also referred to as an area ratio) of a region corresponding to the observation image in the face 12b to a visual field area of the observation image is preferably 100% or more and 700% or less, and more preferably 250% or more and 400% or less. The area ratio is determined by scanning a surface of the yttrium oxide film with the use of the laser microscope, and, for example, it is determined in a manner that a surface area of a region of a unit area of 298 µm×224 µm of the face 12b is measured, and the measured surface area is divided by an area (visual field area) of the observation image. The smaller the aforementioned area ratio becomes, the more the reactivity between the film 12 and plasma can be reduced. As the area ratio becomes larger, a thicker film 12 can be formed. It is indicated that the smaller (closer to 100%) the area ratio is, the flatter the face 12b is. The higher the flatness is, the more the plasma resistance is improved. The film 12 containing yttrium oxide is formed by performing film formation while making yttrium oxide particles to be deposited. When mass productivity is taken into consideration, it is difficult to make the aforementioned area ratio to be 100%. Since the variation in the Vickers hardness $H_V$ of the film 12 is suppressed, even if the area ratio is 700% or less, or even if it is 250% or more and 400% or less, excellent durability can be exhibited.

The film 12 preferably has few defects such as pores. For example, in an observation image obtained by observing a cross section of the film 12 by using a scanning electron microscope (SEM) at 5000 magnifications, a maximum diameter of pores in a unit area of 10 µm×10 µm is 0 µm or more and 1 µm or less, and the number of pores in a unit area of 10 µm×10 µm is 0 or more and 3 or less. The cross section of the film 12 has a surface roughness Ra of 1 µm or less by being subjected to ion milling processing. When it is not possible to measure the unit area of 10 µm×10 µm in one visual field, it is possible to perform observation separately in a plurality of times.

An average diameter of the aforementioned monoclinic crystals is preferably 0.01 µm or more and 5 µm or less. When the average diameter exceeds 5 µm, a pore is likely to be formed in the film 12. The formation of pore becomes a cause of reducing the plasma resistance. When the average diameter is less than 0.01 µm, there is a possibility that the management of manufacturing process becomes complicated. For this reason, the average diameter of the monoclinic crystals is preferably 0.01 µm or more and 5 µm or less, and more preferably 0.05 µm or more and 3 µm or less.

The average diameter is determined by the following method. In an observation image of a unit area of 100 µm×100 µm obtained by observing a surface of the film 12 by using a scanning electron microscope at 5000 magnifications, the number of crystals on a straight line of 100 µm (linear density) is measured. At this time, a region partitioned by a visually-recognizable grain boundary is defined as a crystal grain. When it is not possible to specify a straight line of 100 µm in one visual field, it is possible to perform observation separately in a plurality of times. The average grain diameter is defined by the following expression.

Number of crystals/100 µm=average diameter

Next, an example of a manufacturing method of the component of the embodiment will be described. The example of the manufacturing method of the component of the embodiment includes a process of preparing the base member 11, and a process of forming the film 12 containing yttrium oxide on the base member 11 based on a supersonic free jet physical vapor deposition (SFJ-PVD) method using a yttrium oxide source.

Figure 5:
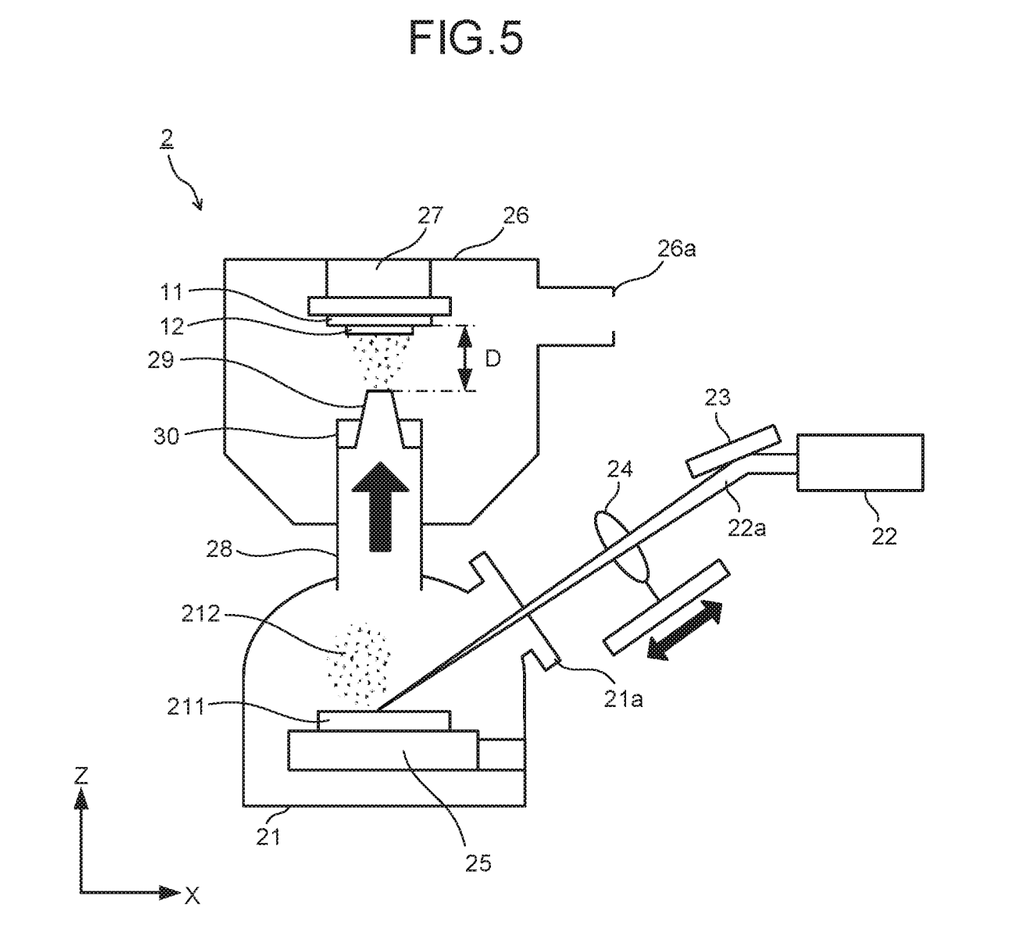
FIG. 5 is a schematic view illustrating a configuration example of a supersonic free jet physical vapor deposition apparatus.

FIG. 5 is a schematic view illustrating a configuration example of a SFJ-PVD apparatus. A SFJ-PVD apparatus 2 illustrated in FIG. 5 includes a chamber 21, a laser oscillator 22, a mirror 23, a lens 24, a stage 25, a chamber 26, a stage 27, a transfer pipe 28, a nozzle 29, and a heater 30.

The chamber 21 has a space for causing evaporation of a target 211 containing yttrium oxide (yttrium oxide source) to form nanoparticles 212. The chamber 21 has a quartz window 21a. The quartz window 21a is provided for irradiating the target 211 with laser light 22a. The target 211 may be powder, a compact (formed by compacting powder, and including no resin binder), or a sintered compact.

The chamber 21 is connected to a vacuum pump via an exhaust port, for example. The exhaust pump exhausts air in the chamber 21 to form a vacuum atmosphere. Further, the chamber 21 may also be connected to a gas supply source via a mass flow controller. The gas supply source supplies an inert gas such as helium into the chamber 21 according to need.

The laser oscillator 22 has a function of oscillating the laser light 22a. As the laser oscillator 22, there can be cited, for example, a Nd:YAG pulse laser oscillator, a $CO_2$ laser oscillator, an excimer laser oscillator, or the like. The laser light 22a from the laser oscillator 22 is reflected by the mirror 23, and is irradiated to the target 211 via the quartz window 21a while being condensed by the lens 24. Note that a distance between the lens 24 and the target 211 can be adjusted by a moving mechanism or the like.

The stage 25 is provided for mounting the target 211 thereon. The stage 25 has a moving mechanism for moving the target 211 in an X-axis direction (a width direction of the SFJ-PVD apparatus 2) and a Y-axis direction (a depth direction of the SFJ-PVD apparatus 2) orthogonal to the X-axis direction and a Z-axis direction (a height direction of the SFJ-PVD apparatus 2). Note that the stage 25 may also have a rotation shaft for rotating on an X-Y plane.

The chamber 26 has a space for forming the film 12 on the base member 11 by making the nanoparticles 212 to be deposited on a surface of the base member 11. The chamber 26 is connected to a vacuum pump via an exhaust port 26a, for example. The vacuum pump exhausts air in the chamber 26 to form a vacuum atmosphere.

The stage 27 is provided for mounting the base member 11 thereon. The stage 27 has a moving mechanism for moving the base member 11 in the X-axis direction, the Y-axis direction, and the Z-axis direction orthogonal to the X-axis direction and the Y-axis direction. This makes it possible to adjust an interval between the base member 11 and the nozzle 29. Note that the stage 27 may also have a rotation shaft for rotating on the X-Y plane.

The above-described moving mechanisms are controlled by a control device or the like. The control device is configured by using hardware which uses a processor or the like, for example. Note that it is also possible to design such that the operations are stored, as operation programs, in a computer-readable recording medium such as a memory, and the operation programs stored in the recording medium are appropriately read by the hardware, to thereby execute the respective operations. Further, the rotation shafts are controlled by the control device, similarly to the moving mechanisms.

The transfer pipe 28 connects the chamber 21 and the chamber 26. In the transfer pipe 28, a gas flow is generated due to a difference between a pressure in the chamber 21 and a pressure in the chamber 26. The gas flow includes the nanoparticles 212 generated in the chamber 21 and a gas atmosphere. This makes the nanoparticles 212 move to the chamber 26 from the chamber 21 via the transfer pipe 28.

The nozzle 29 is provided at a tip of the transfer pipe 28 on the chamber 26 side. The nozzle 29 is heated by the heater 30. The nozzle 29 accelerates the aforementioned gas flow to a supersonic speed, to make the nanoparticles 212 to be jetted and deposited on the base member 11. Consequently, the film 12 can be formed on the base member 11.

In order to reduce the variation in the Vickers hardness $H_V$ of the film 12, it is preferable to satisfy the following manufacturing conditions, for example. A purity of the target 211 is preferably 3 N or more (99.9 mass % or more), and more preferably 4 N or more (99.99 mass % or more). A laser output of the laser oscillator 22 is preferably 0.3 W or more, and more preferably 1.0 W or more and 4.0 W or less. A pressure in the chamber 21 is preferably 10 kPa or more and 100 kPa or less, and more preferably 20 kPa or more and 90 kPa or less. A scanning speed of the stage 27 is preferably 0.1 mm/sec or more and 5 mm/sec or less, and more preferably 0.1 mm/sec or more and 1.2 mm/sec or less. A distance D between the base member 11 and the nozzle 29 is preferably 1 mm or more and 15 mm or less, and more preferably 2 mm or more and 10 mm or less.

In the SFJ-PVD method, it is possible to make fine primary particles and secondary particles to be deposited on the base member 11 through sublimation. Further, by controlling the laser output, a primary particle diameter can be controlled. Besides, by controlling the pressure in the chamber 21 and the distance D between the base member 11 and the nozzle 29, it is possible to control a secondary particle diameter and a phase transformation. For example, the target of yttrium oxide is composed of cubic crystals, and it undergoes a phase transformation to monoclinic crystals due to kinetic energy when the film formation is performed. By causing the phase transformation to the monoclinic crystals, the variation in the Vickers hardness of the film 12 can be reduced, and the density of the film can be increased. In addition to that, by controlling the scanning speed of the stage 27, it is possible to make fine particles to be deposited uniformly.

Next, an example of a semiconductor manufacturing apparatus including the component of the embodiment will be described. An example of a semiconductor manufacturing apparatus of an embodiment includes a chamber, a support provided in the chamber and on which a base member is mounted, and a mechanism for generating plasma in the chamber to perform plasma processing. The above-described mechanism has the component of the embodiment.

As the plasma processing, there can be cited reactive ion etching (RIE), plasma chemical vapor deposition (PCVD), atomic layer deposition (ALD), physical vapor deposition (PVD), sputtering, plasma etching, or the like.

The component of the embodiment is particularly suitable for a semiconductor manufacturing apparatus that performs plasma processing in which a temperature of an environment under which the component is disposed (a substrate temperature, for example) is 500° C. or more and 600° C. or less. Further, the component of the embodiment is suitable for a semiconductor manufacturing apparatus that performs plasma processing under an atmosphere containing halogen ions such as fluorine ions or chlorine ions. Furthermore, the component of the embodiment is suitable for a semiconductor manufacturing apparatus that performs plasma processing using radicals.

Figure 6:
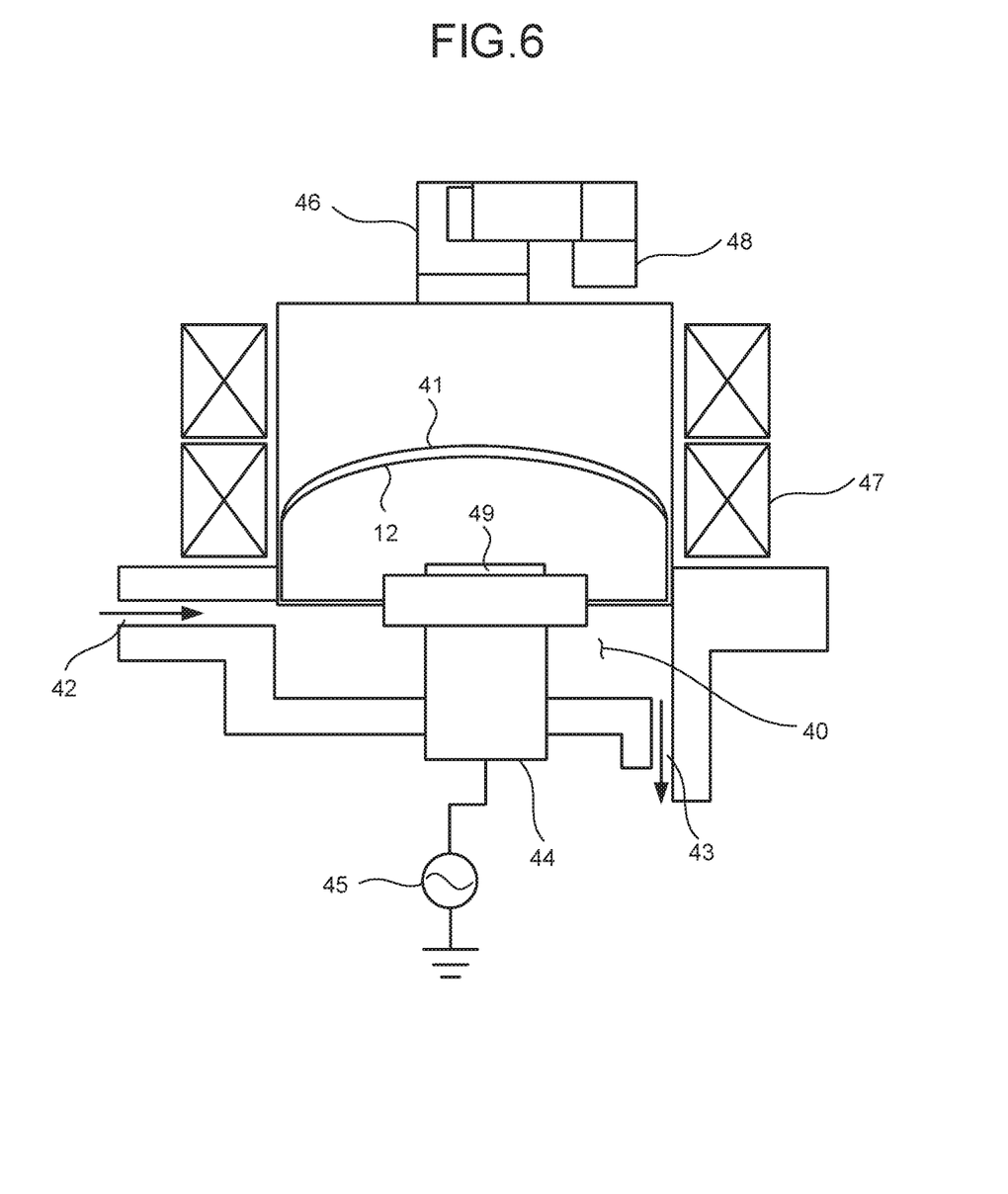
FIG. 6 is a schematic view illustrating a configuration example of a semiconductor manufacturing apparatus.

FIG. 6 is a schematic view illustrating a configuration example of a dry etching apparatus as a semiconductor manufacturing apparatus. A semiconductor manufacturing apparatus illustrated in FIG. 6 includes a processing chamber 40, a discharge tube 41, a sample stage 44, a waveguide 46, a solenoid coil 47 generating a magnetic field in the discharge tube 41, and a magnetron 48 provided to an end portion of the waveguide 46 and generating a microwave.

The processing chamber 40 has a space for performing plasma processing, a gas supply port 42 for introducing an etching gas, and a vacuum exhaust port 43. The vacuum exhaust port 43 is connected to a vacuum pump, for example. The vacuum pump exhausts air in the processing chamber 40 to form a vacuum atmosphere.

The discharge tube 41 is provided at an upper part of the processing chamber 40. The discharge tube 41 is formed of quartz or the like, for example. The component of the embodiment is used for the discharge tube 41, for example. When the discharge tube 41 is a base member, the film 12 in the component of the embodiment is provided to an inner surface of the discharge tube 41. On the outside of the discharge tube 41, the waveguide 46 is provided.

The sample stage 44 is provided inside the processing chamber 40. The sample stage 44 is connected to a high-frequency power source 45, and can receive a high-frequency power.

In the semiconductor manufacturing apparatus illustrated in FIG. 6, an etching gas is introduced from the gas supply port 42 into the inside of the processing chamber 40, and the air in the processing chamber 40 is exhausted under reduced pressure. The microwave from the magnetron 48 is introduced into the inside of the discharge tube 41 by the waveguide 46, and the magnetic field is formed by the solenoid coil 47. By an interaction of an electric field of the microwave and the magnetic field formed by the solenoid coil 47, the etching gas in the discharge tube 41 is turned into plasma. Besides, the high-frequency power is applied to the sample stage 44 by the high-frequency power source 45 to generate a bias voltage, and ions in the plasma are drawn toward a wafer 49 side to perform anisotropic etching.

The component of the embodiment has high plasma resistance. Accordingly, when the component is used in the semiconductor manufacturing apparatus, it is possible to reduce the generation of particles. Further, since it is possible to suppress exposure of a surface of the discharge tube 41, it is possible to reduce the generation of particles due to peeling of a part of the surface.

EXAMPLES

Examples 1 to 7, Comparative Example 1

The SFJ-PVD apparatus was used to form yttrium oxide films on base members, to thereby produce components of Example 1 to Example 7. As a yttrium compound source, a compact made of yttrium oxide powder with purity of 99.9% (3 N) was used. Further, the thermal spraying method was used to form a yttrium oxide film on a base member, to thereby produce a component of Comparative Example 1. As the base member, a substrate of aluminum (A5052) with a plate thickness of 1.5 mm was used. A surface roughness Ra of the base member is 1 μm or less. Further, the film has a size of 10 mm in length and 10 mm in width. The yttrium oxide source and its purity, a laser output, a pressure in a chamber for generating nanoparticles, a distance D between a nozzle and the substrate, a scanning speed, and a thickness of the formed film in each of Examples are shown in Table 1.

TABLE 1

|  | Yttrium compound source | | Laser output (W) | Pressure in chamber (kPa) | D (mm) | Scanning speed (mm/sec) | Thickness of film (μm) |
| --- | --- | --- | --- | --- | --- | --- | --- |
|  | Material | Purity |  |  |  |  |  |
| Example 1 | Y₂O₃ compact | 3N | 1 | 90 | 3 | 1.0 | 12 |
| Example 2 | Y₂O₃ compact | 3N | 2 | 90 | 8 | 1.3 | 17 |
| Example 3 | Y₂O₃ compact | 3N | 1 | 50 | 5 | 0.2 | 26 |
| Example 4 | Y₂O₃ compact | 3N | 1 | 90 | 6 | 0.3 | 10 |
| Example 5 | Y₂O₃ compact | 3N | 1 | 90 | 9 | 1.8 | 17 |
| Example 6 | Y₂O₃ compact | 3N | 1 | 90 | 15 | 2.0 | 11 |
| Example 7 | Y₂O₃ compact | 3N | 1 | 90 | 5 | 0.2 | 30 |
| Comparative example 1 | Y₂O₃ powder | 4N | — | — | — | — | 50 |

Further, the Vickers hardnesses $H_V$ (Vickers hardnesses B1 to B3 and average value A) in portions P1 to P3 of each of the produced yttrium oxide films, the aforementioned mass ratio of monoclinic crystals, the aforementioned area ratio, the aforementioned maximum diameter and number of pores, and the aforementioned average diameter were determined. The portions P1 to P3 are separated from each other by 0.5 mm on a center part in a thickness direction of the yttrium oxide film. Results thereof are shown in Table 2 and Table 3. The area ratio was determined by scanning a unit area of 298 μm×224 μm with a laser microscope. The area ratio was measured based on [surface area measured by laser microscope/unit area (298 μm×224 μm)]×100=area ratio (%). Different unit areas at three portions were measured, and an average value thereof was indicated.

TABLE 2

| | Vickers hardness Hv | | | | | |
| --- | --- | --- | --- | --- | --- | --- |
|  | B1 | B2 | B3 | A | 0.8 × A | 1.2 × A |
| Example 1 | 666 | 764 | 895 | 775 | 620 | 930 |
| Example 2 | 804 | 719 | 712 | 745 | 596 | 894 |
| Example 3 | 657 | 591 | 664 | 637 | 510 | 764 |
| Example 4 | 706 | 660 | 635 | 667 | 534 | 800 |
| Example 5 | 710 | 689 | 706 | 702 | 561 | 842 |
| Example 6 | 764 | 653 | 685 | 701 | 561 | 841 |
| Example 7 | 677 | 703 | 714 | 698 | 558 | 838 |
| Comparative example 1 | 400 | 600 | 650 | 550 | 440 | 660 |

TABLE 3

| | Monoclinic crystal | | | Pore | |
| --- | --- | --- | --- | --- | --- |
|  | Mass ratio (mass %) | Average diameter (μm) | Surface Area ratio (%) | Maximum diameter (μm) | Number (pieces) |
| Example 1 | 75 | 1 | 405 | 0.5 | 1 |
| Example 2 | 70 | 1.2 | 450 | 0.6 | 2 |
| Example 3 | 82 | 0.5 | 391 | 0.1 | 1 |
| Example 4 | 80 | 0.1 | 375 | Absence | 0 |
| Example 5 | 75 | 1.5 | 480 | 0.4 | 2 |
| Example 6 | 65 | 3 | 500 | 1 | 3 |
| Example 7 | 93 | 0.2 | 410 | Absence | 0 |
| Comparative example 1 | 5 | 20 | 432 | 10 | 16 |

From Table 2, it can be understood that each of the yttrium oxide films of the components of Example 1 to Example 6 has the variation in the Vickers hardness $H_V$ lower than that of the yttrium oxide film of the component of Comparative Example 1. Further, from Table 3, it can be understood that each of the yttrium oxide films of the components of Example 1 to Example 6 has a larger mass ratio of monoclinic crystals in the film, a smaller average grain diameter, a smaller maximum diameter of pores, and a smaller number of pores, when compared to those of the yttrium oxide film of the component of Comparative Example 1.

Next, the plasma resistance of each of the components of Examples 1 to 6 and Comparative Example 1 was evaluated. The evaluation was conducted by using a process of performing plasma etching for manufacturing a compound semiconductor. A manufacturing process of a compound semiconductor using a Si substrate was employed. The evaluation was performed by making a fluorine-based gas used for the plasma etching to be brought into contact with the component, and measuring a weight decrease amount and the number of pieces of generated particles. Base member temperatures are shown in Table 4. The weight decrease amount is one after the plasma etching for 20 hours. The number of pieces of generated particles on the Si substrate was indicated while classifying the particles into one having a diameter of less than 0.1 μm and one having a diameter of 0.1 μm or more. The number of pieces of generated particles was set to the number of generated pieces per unit area of 1 cm² on the Si substrate. Results thereof are shown in Table 4.

TABLE 4

|  | Weight decrease amount (mg/cm²) | Number of pieces of particles | | Base material temperature (° C.) |
| --- | --- | --- | --- | --- |
|  |  | Less than 0.1 μm | 0.1 μm or more |  |
| Example 1 | 0.12 | 8 | 12 | 500 |
| Example 2 | 0.1 | 9 | 10 | 500 |
| Example 3 | 0.05 | 4 | 6 | 550 |
| Example 4 | 0.03 | 2 | 8 | 550 |
| Example 5 | 0.1 | 16 | 15 | 600 |
| Example 6 | 0.12 | 28 | 20 | 600 |
| Example 7 | 0.01 | 1 | 4 | 550 |
| Comparative example 1 | 0.57 | 78 | 46 | 500 |

From Table 4, it can be understood that each of the yttrium oxide films of the components of Example 1 to Example 7 has a smaller weight decrease amount and a smaller number of particles, when compared to those of the yttrium oxide film of the component of Comparative Example 1. Based on this, it can be understood that each of the yttrium oxide films of the components of Example 1 to Example 7 has the plasma resistance higher than that of the yttrium oxide film of the component of Comparative Example 1.

While certain embodiments of the present invention have been exemplified above, these embodiments have been presented by way of example only, and are not intended to limit the scope of the inventions. Indeed, the novel embodiments described herein may be embodied in a variety of other forms; furthermore, various omissions, substitutions, changes, and the like in the form of the embodiments described herein may be made without departing from the spirit of the inventions. The accompanying claims and their equivalents are intended to cover such forms or modification examples as would fall within the scope and spirit of the inventions. Further, the aforementioned respective embodiments can be mutually combined to be carried out.

What is claimed is:

1. A component comprising
a film containing yttrium oxide, the film having monoclinic crystals of the yttrium oxide, and an average diameter of the monoclinic crystals being 0.1 μm or more and 5 μm or less, wherein:
a mass ratio of the monoclinic crystals is determined from an X-ray diffraction pattern of the film, and the mass ratio is 60% or more;
a cross section of the film has a first portion, a second portion, and a third portion, and the first to third portions are 0.5 mm or more away from each other;
an observation of the cross section using a scanning electron microscope at 5,000 magnifications gives an observation image in which a maximum diameter of each pore in a unit area of 10 μm×10 μm is 0 μm or more and 1 μm or less;
the film has a first face on a base member and a second face opposite to the first face;
an observation of the second face using a laser microscope at 50 magnifications gives an observation image in which a ratio of a surface area of a region corresponding to the observation image in the second face to an area of observation image is 250% or more and 700% or less; and
a Vickers hardness B1 measured in the first portion, a Vickers hardness B2 measured in the second portion, a Vickers hardness B3 measured in the third portion, and an average value A of the Vickers hardnesses B1 to B3 are numbers satisfying $0.8A \leq B1 \leq 1.2A$, $0.8A \leq B2 \leq 1.2A$, and $0.8A \leq B3 \leq 1.2A$, the average value A being 600 or more.

2. The component according to claim 1, wherein the mass ratio is 80% or more.

3. The component according to claim 1, wherein a thickness of the film is 2 μm or more and 200 μm or less.

4. The component according to claim 1, wherein a number of pores in the unit area of 10 μm×10 μm is 0 or more and 3 or less.

5. An apparatus of manufacturing a semiconductor, comprising
the component according to claim 1.

6. The apparatus according to claim 5, further comprising a discharge tube configured to perform plasma processing, the discharge tube having the component.

7. The component according to claim 2, wherein a number of pores in the unit area of 10 μm×10 μm is 0 or more and 3 or less.

8. The apparatus according to claim 5, wherein a number of pores in the unit area of 10 μm×10 μm is 0 or more and 3 or less.

9. The apparatus according to claim 6, wherein a number of pores in the unit area of 10 μm×10 μm is 0 or more and 3 or less.

* * * * *